(12) United States Patent
Vaiyapuri

(10) Patent No.: US 6,469,376 B2
(45) Date of Patent: Oct. 22, 2002

(54) DIE SUPPORT STRUCTURE

(75) Inventor: Venkateshwaran Vaiyapuri, Singapore (SG)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 09/803,045

(22) Filed: Mar. 12, 2001

(65) Prior Publication Data

US 2002/0127770 A1 Sep. 12, 2002

(30) Foreign Application Priority Data

Mar. 9, 2001 (SG) ..................................... 200101488-5

(51) Int. Cl.$^7$ ............................................. H01L 23/02
(52) U.S. Cl. ..................... 257/686; 257/738; 257/780; 257/777; 257/723; 257/778; 257/787; 257/702
(58) Field of Search ................................. 257/738, 780, 257/686, 702, 778, 723, 777, 787

(56) References Cited

U.S. PATENT DOCUMENTS

| | | | |
|---|---|---|---|
| 5,444,296 A | * 8/1995 | Kaul et al. .................... 257/686 |
| 5,652,463 A | * 7/1997 | Weber et al. ................ 257/706 |
| 5,674,785 A | 10/1997 | Akram et al. | |
| 5,808,878 A | * 9/1998 | Saito et al. .................... 361/818 |
| 5,952,611 A | * 9/1999 | Eng et al. .................... 174/52.4 |
| 5,956,233 A | * 9/1999 | Yew et al. .................... 361/760 |
| 5,973,403 A | 10/1999 | Wark | |
| 5,994,166 A | 11/1999 | Akram et al. | |
| 6,013,948 A | * 1/2000 | Akram et al. ................. 257/698 |
| 6,020,629 A | * 2/2000 | Farnworth et al. ........... 257/686 |
| 6,091,138 A | * 7/2000 | Yu et al. ....................... 257/686 |
| 6,181,002 B1 | 1/2001 | Juso et al. | |
| 6,181,008 B1 | * 1/2001 | Avery et al. ................. 257/723 |
| 6,219,254 B1 | * 4/2001 | Akerling et al. ............. 361/763 |
| 6,262,488 B1 | 7/2001 | Masayuki et al. | |
| 6,265,771 B1 | 7/2001 | Ference et al. | |
| 6,316,727 B1 | 11/2001 | Liu | |
| 2001/0015485 A1 | 8/2001 | Song et al. | |

FOREIGN PATENT DOCUMENTS

WO    WO 97/37374    10/1997

OTHER PUBLICATIONS

"Multi–Chip Module on Laminate, High–performance packaging for today's silicon", *IBM Microelectronics*, 1998.

* cited by examiner

Primary Examiner—Sara Crane
Assistant Examiner—Nitin Parekh
(74) Attorney, Agent, or Firm—Dickstein Shapiro Morin & Oshinsky LLP

(57) ABSTRACT

Disclosed is a method of forming a support structure for supporting multiple dies and resulting structure. The support structure has a cavity with an upper die support surface, sidewalls providing the upper die support surface, and a lower die support bottom surface connected with the sidewalls. The support structure can be formed of a plurality of layers. A first semiconductor die is secured on the lower die support surface and a second semiconductor die is secured to the upper die support surface. An aperture can be formed from the structure bottom surface to the cavity to facilitate electrical connections between the first die and electrical contact areas on the support structure. An encapsulating material is formed around the dies, the electrical connections, and the vacant cavity space to form a packaged semiconductor device.

26 Claims, 4 Drawing Sheets

DIE SUPPORT STRUCTURE

BACKGROUND OF THE INVENTION

The invention relates to a method of forming a packaged semiconductor device and the resulting structure.

DESCRIPTION OF RELATED ART

In some types of semiconductor die packaging a die is secured to the surface of a die support structure. Electrical connections are made between the die and the support structure. The die, electrical connections, and at least a part of the support structure are covered with an encapsulating material to form a semiconductor package. Leads extend from the package for electrical connection to any external circuit. The package is generally secured to a printed circuit board or other mounting substrate when in use. One method of reducing the thickness of a conventional semiconductor device package is to use a thin die support structure. A thin support structure is generally about 50 microns to 75 microns thick while a conventional support structure is typically about 200 microns thick. However, a thin support structure is typically about 100% more expensive than a conventional thicker structure and thus increases the cost of packaged semiconductor devices. Another disadvantage of a thin support structure is that during fabrication the thin structure flexes and/or bows more than a thicker structure. This bowing or flexing can weaken the strength of the die's attachment to the structure as well as damage fragile electrical contacts between the die and support structure.

Yet another disadvantage of a thin support structure is its limited ability to secure and support multiple dice on a single support structure. One method of constructing multiple die assemblies on a conventional support structure is to stack dice vertically. U.S. Pat. No. 5,994,166 issued Nov. 30, 1999, to Salman Akram and Jerry M. Brooks discloses a semiconductor package with two die vertically stacked on opposing sides of a substrate. However, if multiple semiconductor dice are vertically stacked on a substrate the height of the packaged semiconductor devices increases. If on the other hand, multiple semiconductor dice are mounted horizontally side by side on a support structure, both the thickness and area of the support structure must be increased to support the multiple dice which results in larger packaged semiconductor devices. Thus, conventional techniques for securing multiple dice to a single support structure increase the dimensions of packaged semiconductor devices. It would be advantageous to have a semiconductor support structure that can secure and support multiple semiconductor dice which will results in a smaller dimensions semiconductor packages than conventional techniques while reducing the cost of the die support structure.

SUMMARY OF THE INVENTION

The invention provides a packaged semiconductor structure in which multiple semiconductor dice are secured to a common support structure. In an exemplary embodiment, a multi-layered support structure is formed. The support structure has a central cavity with an open surface at the top and a die support bottom surface. An aperture with a perimeter smaller than that of the central cavity is formed from the bottom exterior of the support structure to the central cavity. A first semiconductor die is supported and secured to the cavity bottom surface. The first die is electrically connected to the bottom surface of the support structure by electrical connections, e.g., wire bonds, which extend from the die through the aperture to electrical contact areas on the bottom exterior surface of the support structure. A second semiconductor die is secured on the top surface of the support structure and electrical connections are made between the second die and electrical contact areas on the bottom exterior surface of the support structure. The dice, electrical connections and structure cavity are encapsulated with encapsulating material to form a packaged semiconductor assembly.

BRIEF DESCRIPTION OF THE DRAWINGS

These and other advantages and features of the invention will be more readily understood from the following detailed description of the invention which is provided in connection with the accompanying drawings.

DETAILED DESCRIPTION OF EXEMPLARY EMBODIMENTS

The invention will be described as set forth in the exemplary embodiments illustrated in FIGS. 1–7. Other embodiments may be utilized and structural changes may be made without departing from the spirit or scope of the invention.

Figure 1:
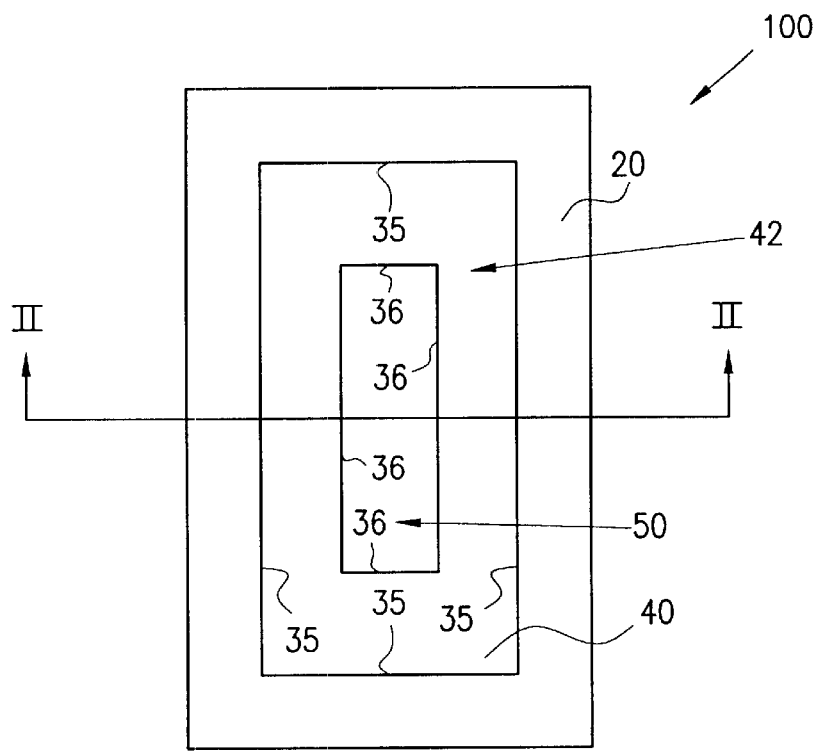
FIG. 1 is a top view of a semiconductor support structure of the invention.
Figure 2:
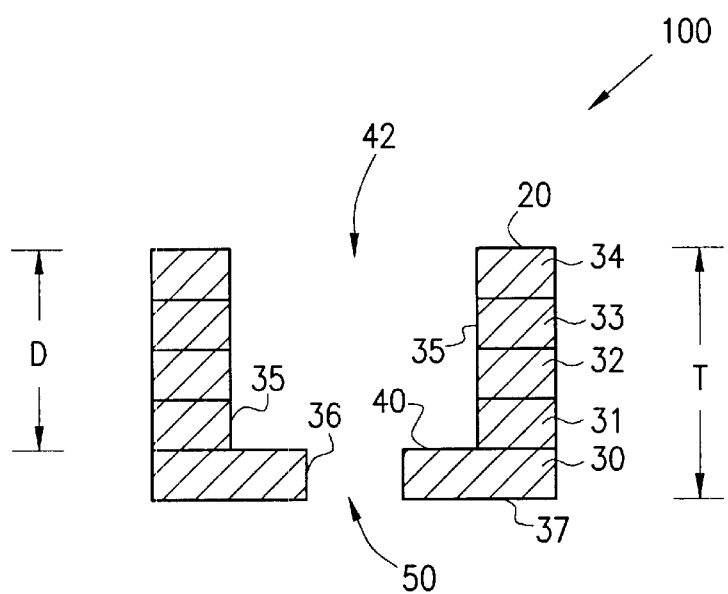
FIG. 2 is a cross-sectional view of FIG. 1.

FIG. 1 illustrates a top view of a semiconductor support structure 100 of the invention. FIG. 2 is an cross-sectional view of FIG. 1 taken at line II—II. The support structure 100 has a top surface 20, exterior perimeter 22, a cavity 42 with interior perimeter 35 and bottom surface 40. An aperture 50 with interior perimeter 36 is provided in bottom surface 40. The interior perimeter 36 of aperture 50 is smaller in size that the interior perimeter of cavity 42 to form bottom surface 40. The support structure 100 is formed of five thin stacked layers 30–34 as shown in FIG. 2. In an exemplary embodiment, the structure 100 is formed of stacked layers of any suitable semiconductor die support material, such as, for example, Bismaleimide Triazine (BT) which may be used for all five layers 30–34.

It is to be understood that the illustration of a five-layer structure 100 is exemplary and that the support structure 100 could be constructed with less than or more than five layers. The support structure 100 is fabricated by securing the five layers 30–34 to each other using techniques well known in the art, for example, with adhesives. The total structure thickness and number of layers is based on the thickness of a die which will be mounted within cavity 42 and the required spacing for various electrical contacts. The support structure 100 can be of any dimension (height, length, or width) suitable for mounting semiconductor dice. An exemplary thickness T for support structure 100 is about 500 microns or less and an exemplary depth D of cavity 42 is 400 microns or less. It is to be understood that each layer as shown in FIG. 2 could be made of a multi-layer laminate as well.

One technique for fabrication of the support structure 100 is described below. Central layer 32 is formed of film of about 200 microns thickness, but larger and smaller thickness are possible. Central layer 32 can also be made of multiple layers, such as a multi-layer laminates. The other layers 30–31, 33–34 thickness can be sized based on the dimensions of the die 60 (FIGS. 3 and 4) and the desired overall package thickness. It is to be understood that the exemplary layers 30–34 can comprise similar or different material and can vary in thickness from each other. Second layer 33 is secured above central layer 32. Fourth layer 31 is secured below central layer 32. First layer 34 is secured above second layer 33. Finally fifth layer 30 is secured to fourth layer 31. It is to be understood that the method of stacking or fabricating the support structure 100 layers 30–34 and/or method of securing the layers 30–34 can vary without limiting the scope of the invention.

One advantage of using a conventional layer thickness of, for example, 200 microns for central layer 32 is that such a conventional layer thickness is commonly available at a lower cost than a thinner material layer. In an exemplary embodiment, the layers 30–34 contain interior electrical paths 90 through the various layers and providing electrical paths 90 for the semiconductor dice 60, 80 (FIG. 7) from the structure's top surface 20 down to the structure's bottom surface 37. It is to be understood that external electrical paths (not shown) located on the surface of layers 30–34 are also possible either adjacent to the cavity's interior perimeter 35 or along the exterior perimeter 22 of the structure 100. Also the die 60 (FIG. 4), while shown as connected by wire bottom to electrical contact areas 76 provided on layer 30, can also connect to the electrical contact areas 76 through conductive vias internal to the layer 30.

An open cavity 42 is formed by layers 30–34 which define a cavity perimeter 35 and a bottom surface 40. The cavity 42 can be any suitable shape. An aperture 50 is shown formed in the fifth layer 30, i.e., which extends from bottom surface 37 to the cavity 42. The aperture 50 has an aperture perimeter 36 which is smaller than the cavity perimeter 35 to provide a mounting surface for die 60. The cavity 42 and aperture 50 can be formed using techniques well known in the art, such as milling. Alternatively preformed layers having holes therein can be stacked to form the support structure 100, having cavity 42 and aperture 50. It is to be understood that the cavity depth D could be varied without limiting the scope of the invention. The cavity depth D is sized based on the thickness of the semiconductor die 60 (FIG. 4) secured inside the cavity 42. An exemplary dimension for cavity depth D is about 250 microns or less. Aperture 50 can be any suitable shape. Aperture 50 is sized to provide a die support surface 40. The dimensions of aperture 50 will vary depending on the dimension of the first semiconductor die 60 and the necessary clearance for proper die 60 operation or for electrical connection. It is to be understood that aperture 50 is optional and is an exemplary way of providing an electrical contact path between the die 60 and structure 100.

Figure 3:
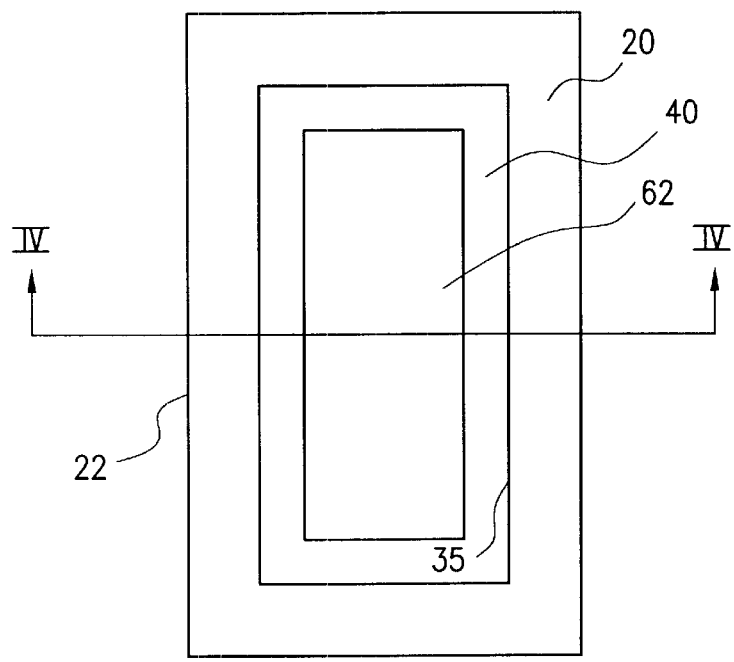
FIG. 3 is a top view of a semiconductor support structure of the invention after a first semiconductor die has been secured inside a cavity of the support structure.
Figure 4:
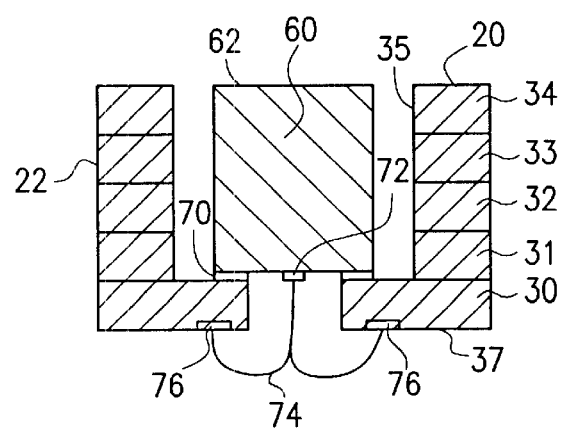
FIG. 4 is an cross-sectional view of FIG. 3.
Figure 5:
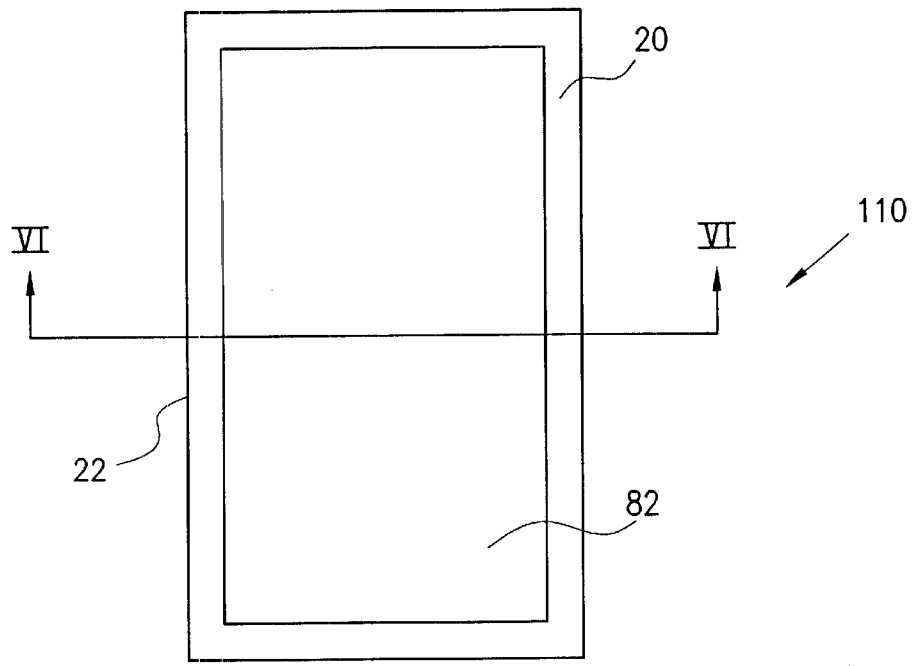
FIG. 5 is a top view of a semiconductor support structure of the invention after a second semiconductor die has been secured to the top of surface of the support structure.
Figure 6:
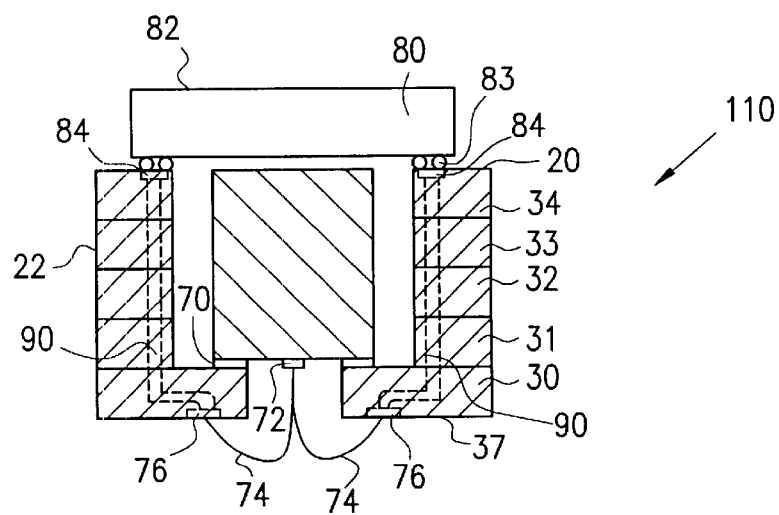
FIG. 6 is a cross-sectional view of FIG. 5.

After support structure 100 is fabricated as shown in FIGS. 1 and 2, a semiconductor die 60, shown in FIGS. 3 and 4, is secured to bottom layer 30, such as, for example, by adhesive layer, bonding tape or solder balls 70, using techniques well known in the art. It is to be understood that more than one semiconductor die 60 can be secured inside the cavity 42, such as two dies 60 stacked on top of each other or side-by-side on the bottom surface 40. In an exemplary embodiment, semiconductor die 60 is a board-on-ship (BOC), where a chip has electrical contact areas formed on the chip surface and the chip is directly bonded to a support surface, such as, a printed circuit. The semiconductor die 60 is electrically connected 74 to electrical contacts areas 76, such as, for example, bond pads, on the bottom surface 37 of support structure 100. In an exemplary embodiment, wire bonds 74 extend from the die 60 electrical contact areas 72 through aperture 50 to the support structure electrical contact areas 76. It is to be understood that various materials, types, methods, techniques, and locations for electrical contacts areas 72, 76 and electrical connections 74 are possible and that the wire bonds disclosed above and shown in FIG. 4 are only exemplary of one way of electrically connecting die 60 to electrical contact areas 76 provided on the bottom surface 37.

After semiconductor 60 is electrically connected to the support structure 100, a second semiconductor die 80 (FIGS. 5–6) is secured to the top surface 20 of the support structure 100 by connections 83. In an exemplary embodiment the second die 80 is a flip chip, a chip or package where bumps or connecting metal are formed on the chip surface and the chip is flipped over for soldering to a support surface, and is secured by a solder ball connections 83 to electrical contact areas 84 located on the top surface 20 of support structure 100. The second die 80 is arranged to align with various electrical contact areas 84 which are in electrical communication through electrical vias 90 through layers 30–34 to electrical contact areas 76 on the structure bottom surface 37. It is to be understood that the electrical contact areas between die 80 and the structure bottom surface 37 could also be by external conductors on the sidewalls 22, 35 of the support structure 100.

Figure 7:
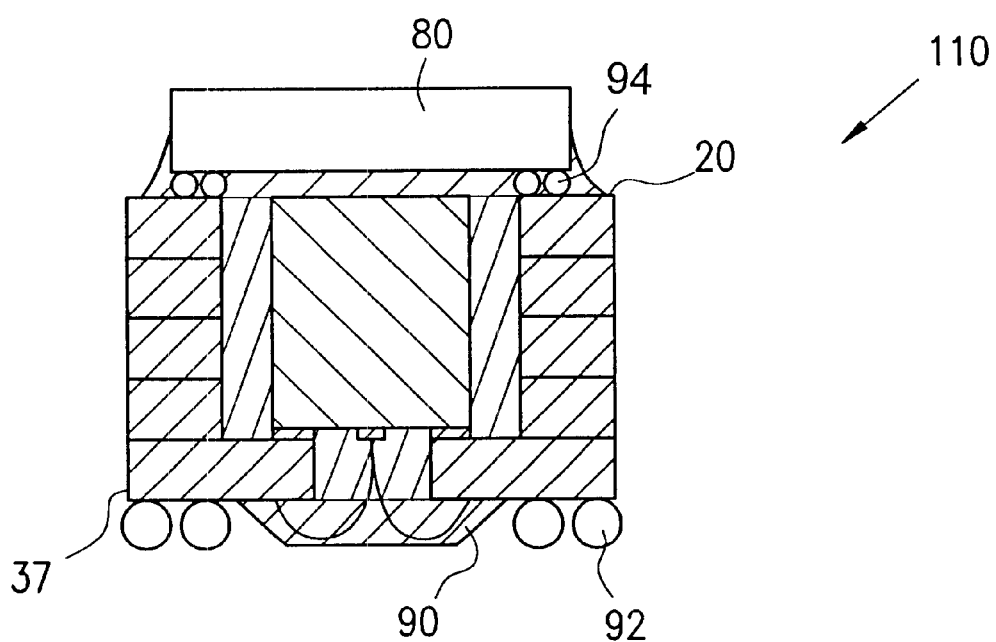
FIG. 7 is a cross-sectional view of a semiconductor support structure of the invention after the semiconductor dice have been encapsulated.

FIG. 7 shows a packaged semiconductor assembly 110 after an encapsulation material 94 has been deposited in cavity 42 and aperture 50 and beneath die 80. The encapsulation material 94 can be any well know material suitable for semiconductor assemblies. The encapsulation material 94 can be selected to provide under fill support for the second semiconductor die 80 as well as to reduce the coefficient of thermal expansion between the dies 60, 80 and structure 100. The encapsulation material 94 is shown covering electrical contacts 74, 83 of the die 60, 80. It is to be further understood that the encapsulation process could be broken into two steps, a first step after the first semiconductor die 60 is secured to the structure 100 and before the second die 80 is secured. And a second step after the second semiconductor die 80 is secured to the structure 100. After the encapsulation material 94 is deposited, additional electrical contact areas 92 can be added to the semiconductor assembly 110, on electrical contact areas 76 such as a fine ball grid array along the bottom surface 37 of the structure 100. It is to be understood that multiple packaged semiconductor assemblies 110 can be formed in a large structure and singulated after fabrication, or at any intermediate stage of fabrication.

Having thus described in detail the exemplary embodiments of the invention, it is to be understood that the invention defined by the appended claims is not to be limited by particular details set forth in the above description as many apparent variations thereof are possible without departing from the spirit or scope of the invention. Accordingly, the above description and accompanying drawings are only illustrative of exemplary embodiments which can achieve the features and advantages of the invention. It is not intended that the invention be limited to the embodiments shown and described in detail herein. The invention is only limited by the scope of the following claims.

What is claimed as new and desired to be protected by Letters Patent of the United States is:

1. A die support structure comprising:
a bottom and sidewalls extending from said bottom, said bottom and sidewalls defining a cavity, said bottom having an aperture therein, said aperture having a smaller perimeter than said cavity, said sidewalls defining an upper die support surface which has an opening therein, said bottom defining a lower die support surface, and said cavity extending from the opening to said lower die support surface,
wherein,
a top surface of said upper support surface is adapted to support at least one die; and
a top surface of said lower die support surface is adapted to support at least one die within said cavity.

2. The die support structure of claim 1, wherein said support structure further comprises a plurality of laminated layers which form said bottom and sidewalls.

3. The die support structure of claim 1, wherein said support structure has a conductive path from said upper die support surface to said bottom.

4. The die support structure of claim 3, wherein said conductive path is internal to said sidewalls.

5. The die support structure of claim 3, wherein said conductive path is external to said sidewalls.

6. The die support structure of claim 1, further comprising electrical contact areas on said support structure bottom surface.

7. The die support structure of claim 6, further comprising solder balls connected with said electrical contact areas.

8. A semiconductor assembly comprising:
a die support structure wherein said support structure has a cavity, said cavity being defined by,
an upper die support surface which has an opening therein; and
a lower die support surface having an aperture therein, said aperture having a smaller perimeter than said cavity, said cavity extending from said opening to said lower die support surface; and
at least one semiconductor die secured, within said cavity, to a top surface of said lower die support surface.

9. The semiconductor assembly of claim 8, wherein said at least one semiconductor die is electrically coupled to said support structure.

10. The semiconductor assembly of claim 9, wherein said at least one semiconductor die has at least one wire bond extending from said die to at least one electrical contact area on said support structure.

11. The semiconductor assembly of claim 10, wherein said at least one wire bond extends from said at least one die through said aperture to said at least one electrical contact area.

12. The semiconductor assembly of claim 8, wherein said support structure further comprises a plurality of laminated layers.

13. The semiconductor assembly of claim 8, wherein said support structure has a conductive path from said upper die support surface to an opposing side of said support structure.

14. The semiconductor assembly of claim 13, wherein said conductive path is internal to said support structure.

15. The semiconductor assembly of claim 13, wherein said conductive path is external to said support structure.

16. The semiconductor assembly of claim 8, wherein said support structure has electrical contact areas on said support structure bottom surface.

17. The semiconductor assembly of claim 16, further comprising solder balls connected with said electrical contact areas.

18. The semiconductor assembly of claim 8, wherein said at least one semiconductor die is a board-on-chip.

19. The semiconductor assembly of claim 8, wherein said at least one semiconductor die is electrically coupled to said support structure.

20. A semiconductor assembly comprising:
a die support structure wherein said support structure has a bottom and sidewalls extending from said bottom, said bottom and sidewalls defining a cavity, said bottom having an aperture therein, said aperture having a smaller perimeter than said cavity, said sidewalls defining an upper die support surface which has an opening therein and said bottom defining a lower die support surface, said cavity extending from the opening to said lower die support surface, each of said upper and lower die support surfaces being adapted to support at least one die; and
at least one semiconductor die secured, within said cavity, to an upper surface of said lower die support surface.

21. A semiconductor assembly comprising:
a die support structure wherein said support structure has a cavity, said cavity being defined by an upper die support surface which has an opening therein and a lower die support surface wherein said cavity extends from the opening to said lower die support surface said lower support surface having an aperture therein, said aperture having a smaller perimeter than said cavity;
at least one semiconductor die secured, within said cavity, to a top surface of said lower die support surface;
at least one electrical connection between said at least one semiconductor die and said support structure; and
at least a portion of said semiconductor assembly encapsulated with encapsulation material.

22. A semiconductor assembly comprising:
a semiconductor support structure wherein said structure has a cavity, said cavity being defined by an upper die support surface which has an opening therein and a lower die support surface having an aperture therein, said aperture having a smaller perimeter than said cavity, and said cavity extending from said opening to said lower die support surface;
at least one semiconductor die secured, within said cavity, to a top surface of said lower die support surface; and
at least one semiconductor die secured to an upper surface of said upper die support surface.

23. The semiconductor assembly of claim 22, wherein said at least one semiconductor die secured to said upper die support surface is a flip chip.

24. The semiconductor assembly of claim 22, wherein said at least one semiconductor die is electrically coupled to said support structure.

25. A semiconductor assembly comprising:
a die support structure wherein said structure has a cavity, said cavity being defined by an upper die support surface which has an opening therein and a lower die support surface having an aperture therein, said aperture having a smaller perimeter than said cavity, and said cavity extending from said opening to said lower die support surface;
at least one semiconductor die secured, within said cavity, to a top surface of said lower die support surface, said die electrically coupled to said structure;
at least one semiconductor die secured to a top surface of said upper die support structure, said die electrically coupled to said structure; and at least a portion of said semiconductor assembly is encapsulated with encapsulation material.

26. A semiconductor assembly comprising:

a die support structure wherein said structure has a cavity, said cavity being defined by an upper die support surface which has an opening therein and a lower die support surface having an aperture therein, said aperture having a smaller perimeter than said cavity, and said cavity extending from said opening to said lower die support surface;

at least one board-on-chip secured, within said cavity, to a top surface of said lower die support surface, said board-on-chip electrically coupled to said support structure; and at least one flip chip secured to a top surface of said upper die support surface, said flip chip electrically coupled to said support structure.

* * * * *

UNITED STATES PATENT AND TRADEMARK OFFICE
CERTIFICATE OF CORRECTION

PATENT NO.    : 6,469,376 B2
DATED         : October 22, 2002
INVENTOR(S)   : Venkateshwaran Vaiyapuri It is certified that error appears in the above-identified patent and that said Letters Patent is hereby corrected as shown below:

Column 1,
Line 50, "results in a" should be -- result in --; and

Column 2,
Line 45, "that" should be -- than --.

Column 6,
Claim 19 should be deleted.

Signed and Sealed this

Twenty-fifth Day of November, 2003

JAMES E. ROGAN
*Director of the United States Patent and Trademark Office*